(12) United States Patent
Imken et al.

(10) Patent No.: US 6,489,042 B2
(45) Date of Patent: *Dec. 3, 2002

(54) PHOTOIMAGEABLE DIELECTRIC MATERIAL FOR CIRCUIT PROTECTION

(75) Inventors: Ronald L. Imken, Round Rock, TX (US); Robert S. Clough, St. Paul, MN (US)

(73) Assignee: 3M Innovative Properties Company, St. Paul, MN (US)

(*) Notice: Subject to any disclaimer, the term of this patent is extended or adjusted under 35 U.S.C. 154(b) by 0 days.

This patent is subject to a terminal disclaimer.

(21) Appl. No.: 09/982,684

(22) Filed: Oct. 18, 2001

(65) Prior Publication Data

US 2002/0114969 A1 Aug. 22, 2002

Related U.S. Application Data

(60) Continuation-in-part of application No. 09/917,543, filed on Jul. 27, 2001, which is a division of application No. 09/219,265, filed on Dec. 23, 1998, now Pat. No. 6,294,270.

(51) Int. Cl.[7] .......................... H01L 29/12; C08L 53/00
(52) U.S. Cl. ...................... 428/620; 523/403; 523/427; 523/436; 523/437; 524/81; 524/155; 524/158; 524/161; 524/163; 524/174; 525/88; 525/95; 525/98; 525/108; 428/626; 428/901

(58) Field of Search ................................. 523/403, 427, 523/436, 437; 524/81, 155, 158, 161, 163, 174; 525/88, 95, 98, 108; 428/620, 626, 901

(56) References Cited

U.S. PATENT DOCUMENTS

| 4,250,053 A | 2/1981 | Smith .......................... 252/426 |
| 4,256,828 A | 3/1981 | Smith .......................... 430/280 |
| 5,227,008 A | 7/1993 | Klun et al. .................. 156/630 |
| 5,478,885 A | 12/1995 | Masse et al. ............. 525/92 H |
| 5,554,664 A | 9/1996 | Lamanna et al. ............. 522/25 |
| 6,177,357 B1 | 1/2001 | Lu .............................. 438/745 |
| 6,294,270 B1 | 9/2001 | Clough ........................ 428/620 |

FOREIGN PATENT DOCUMENTS

| EP | 0 658 603 A2 | 6/1995 |
| WO | WO 98/22531 | 5/1998 |

*Primary Examiner*—Samuel A. Acquah
(74) *Attorney, Agent, or Firm*—Darla P. Fonseca

(57) ABSTRACT

An electronic circuit device comprising at least one substrate having a photoimageable covercoat, comprising at least 95 weight percent of at least one epoxy-modified aromatic vinyl-conjugated diene block copolymer and a catalyst comprising an onium salt selected from a triarylsulfonium salt and a diaryliodonium salt, wherein the covercoat is formed by solvent coating or extrusion and then heat laminated onto at least a portion of the substrate.

21 Claims, 1 Drawing Sheet

PHOTOIMAGEABLE DIELECTRIC MATERIAL FOR CIRCUIT PROTECTION

This application is a continuation-in-part of pending U.S. application Ser. No. 09/917,543, filed on Jul. 27, 2001, which is a divisional of U.S. application Ser. No. 09/219,265, filed on Dec. 23, 1998, now U.S. Pat. No. 6,294,270.

FIELD OF THE INVENTION

This invention relates to an electronic circuit device comprising a photoimageable covercoat comprising an epoxy-modified aromatic vinyl-conjugated diene block copolymer

BACKGROUND OF THE INVENTION

A major trend in the electronics industry is to make products smaller, lighter and faster while maintaining or improving their functionality. One key technology enabling the creation of more compact products involves electronic packaging and assembly. Electronic packaging and assembly constitutes the materials and processes required to interconnect a semiconductor chip (IC chip) to other electronic or electrical components. Besides the semiconductor chip, various materials can be incorporated into an electronic package, such as flexible circuitry (metal circuitry on polyimide or other polymer films), metal stiffeners, electrically conductive layers, electrically insulating layers, and heat sinks.

Flexible circuitry is commonly found in applications ranging from medical devices to hard disk drives to inkjet printer pens. Flexible circuits, thus used, can be exposed to a wide range of environmental factors that may cause degradation in the circuitry over time. Some of the harsh environments that a flexible circuit might see during its lifetime include high temperature and/or high humidity, cycling between temperature extremes, submersion in corrosive fluids during which the circuit has an applied voltage bias across it. If the circuit is not sufficiently protected during this exposure, damage may occur including a decrease in electrical performance, corrosion of circuit traces or even device failure.

The circuit traces are commonly protected from temperature and other environmental factors, including solvents, inks, and other corrosive chemicals by applying a durable insulating material on the exposed surface of the circuitry. This insulating layer is frequently referred to as a "covercoat" or a solder mask. Covercoats and encapsulants are used to protect the circuitry, and are applied by a variety of precise placement printing processes, such as screen printing, transfer printing and the like, to ensure that sections of circuitry which need to make further connections will be left uncoated. However, as the pitch of the circuitry continues to shrink, current application methods become less capable of meeting the fine pitch placement requirements. One possibility for overcoming this problem would be to use a photoimageable covercoat that can withstand the environment to which the package may be subjected.

The use of photoimageable materials in flexible circuit manufacture as photoresists is known. In U.S. Pat. No. 5,227,008, use of a dry film photoresist is disclosed, and in U.S. Pat. No. 6,177, 357, a liquid photoresist is disclosed. However, such photoresists are designed to be temporary in nature, rather than providing long term protection. They are completely removed during the flexible circuit manufacturing process.

A photoimageable polyimide is disclosed in U.S. Ser. No. 09/547,390, which is deposited by electrophoretic deposition using aqueous acid developers.

Epoxidized styrene-diene block copolymers, such as epoxidized styrene-butadiene or epoxidized styrene-isoprene block copolymers, have been described in U.S. Pat. No. 5,478,885. In some applications, the epoxidized block copolymers have been used as rubber toughening agents in commonly-used epoxy resins. Typically, the toughening agent constitutes a small percentage of the total composition.

Cured compositions comprising epoxy resins and epoxy-modified aromatic vinyl-conjugated diene block copolymers have been described in EP 658603. The compositions can contain from 5 to 95 parts by weight of an epoxy resin, preferably from 20 to 80 parts by weight. When the composition contains less than 5 parts by weight of either component, a loss of mechanical properties is reported. Compositions comprising cured epoxidized styrene-diene block copolymers useful as multilayered molding materials have been described in WO 98/22531. Compositions further comprising from 0.01 to 25 parts by weight added polyfunctional co-reactants are also described. Epoxy resins are not disclosed as co-reactants. Use of these materials as covercoats in electronic packaging applications is not suggested.

SUMMARY OF THE INVENTION

Briefly, this invention provides an electronic circuit device comprising a photoimageable covercoat composition including at least about 95 weight percent of a curable epoxy-modified aromatic vinyl-conjugated diene block copolymer, up to 5 weight percent of an epoxy resin, such weights being exclusive of catalyst, and from about 0.25 percent by weight to about 1.5 percent by weight of an epoxy catalyst.

In one embodiment, the catalyst is present as a catalyst solution; in an alternate embodiment, the catalyst is present in solid form.

In another aspect, this invention provides a method of using a curable resin composition in an article comprising the steps of:

forming a curable resin composition on a liner by a means selected from the group consisting of extrusion and solvent coating, wherein the resin composition includes in the range of 95 to 100 weight percent of an epoxy-modified aromatic vinyl-conjugated diene block copolymer, optionally up to 5 weight percent of an epoxy resin, the weight of both components based on the weight of epoxy-bearing materials, and from about 0.25 to about 1.5 weight percent of an epoxy catalyst, and laminating the covercoat onto at least a portion into an electronic circuit device.

Upon photoimaging and curing the copolymer resin composition, it exhibits good contrast, and low swelling in the areas exposed to ultraviolet radiation, while using low photoinitiator concentrations. The cured copolymer resin composition also provides a protective permanent covercoat for the electronic circuit.

In this application, these terms have the following meanings.

1. The term "electronic circuit device" means a device comprising an electronic circuit or electronic component, such as (1) an electronic package such as a ball grid array (BGA), a laminated microinterconnect (LMI), multi-chip module, or a chip scale package (CSP); (2) simple flexible circuitry wherein a copper foil is adhered to a polymer substrate with an adhesive, or plated onto a polymer substrate either selectively or totally; or (3) an electronic component such as a semiconductor chip connected to a circuit on a substrate.

2. The term "electronic circuit" means the path of an electric current or electrons and can include such elements as electric conductors, e.g., metallic wires or metallic traces, and electronic components such as semiconductor chips, transistors, diodes, capacitors, resistors, inductors, etc.

3. The term "epoxy-bearing material" means an epoxy-modified aromatic vinyl-conjugated diene plus epoxy resin, if present.

4. The term "solder resistance" means resistance to heat at the temperature of solder reflow.

5. The term "resin composition" means an epoxy-bearing material plus a curative or catalyst.

6. The term "epoxy-modified aromatic vinyl-conjugated diene block copolymer" includes such copolymers that are partially hydrogenated prior to or subsequent to epoxy-modification.

7. The term "catalyst solution" means a 50% by weight of a triarylsulfonium hexafluoroantimonate salt mixture in propylene carbonate, such as that available as UVI-6974, from Dow Chemical Company, Midland, Mich.

8. The term "contrast" means a measure of the material response between ultraviolet radiation exposed and nonexposed regions during the developing process. High contrast would provide for removal of unexposed regions of the material without any undesirable impact on the exposed regions. Low contrast would suggest that removal of unexposed regions leads to damage such as erosion or swelling of the exposed regions.

All amounts, ratios and ingredients herein are by weight unless otherwise specifically noted.

The copolymer resin composition has shown no ink sorption by visual observation after immersion for eleven days at room temperature. The copolymer resin composition also has excellent resistance to corrosive, aqueous acidic and/or alkaline environments.

DETAILED DESCRIPTION OF THE INVENTION

Figure 1:
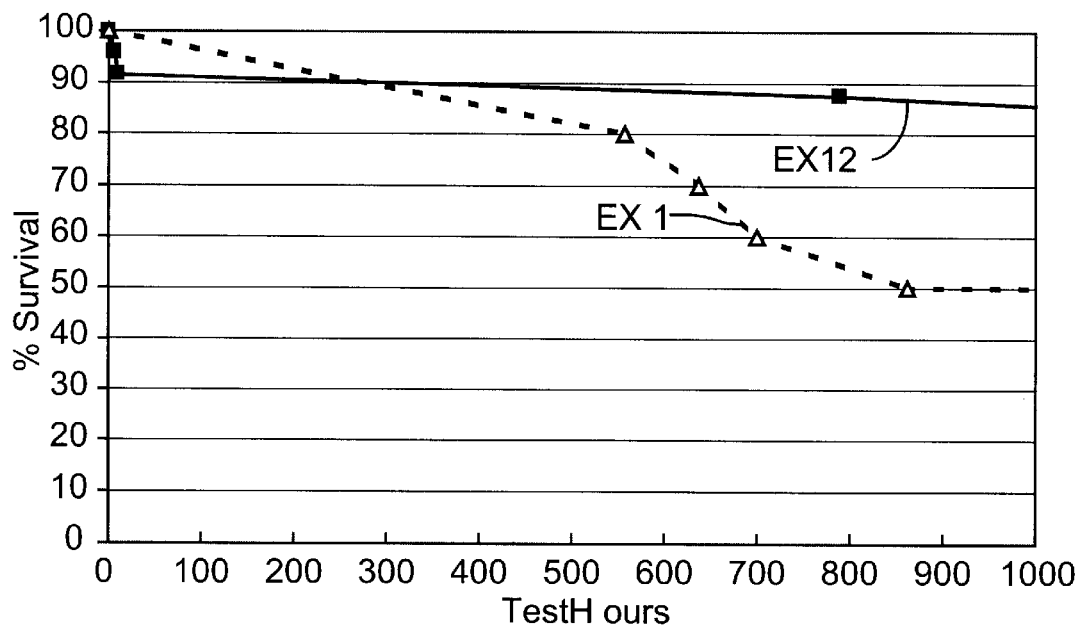
FIG. 1 is a graph showing the performance of photoimageable eSBS material and commercial liquid screenable epoxy urethane acrylate at 20–30 volts bias in an ink environment.

The covercoat copolymer resin composition of the electronic circuit device of the present invention comprises in the range of 95 to 100 weight percent epoxy-modified aromatic vinyl-conjugated diene block copolymer, wherein the block copolymer also may be hydrogenated, up to about five (5) weight percent epoxy resin based on the weight of epoxy-bearing material in the resin composition, and an epoxy catalyst. The epoxy catalyst is present in an amount of from about 0.25 weight percent to about 1.5 weight percent, based on the total weight of the epoxy bearing material. If the catalyst is used in solution form, the amount of solution should be present in an amount such that the solids weight is within the above range. The catalyst is typically about 50% solids, and such a solution is then used at between 0.5 and 3 weight percent of the epoxy bearing material.

The epoxy-modified aromatic vinyl-conjugated diene block copolymer preferably has an epoxy equivalent weight in the range of 100 to 2500, more preferably 100 to 2000, and most preferably 200 to 1000.

The epoxy-modified aromatic vinyl-conjugated diene block copolymer, which preferably is an epoxidized styrene-diene block copolymer, comprises (i) a polymer block derived from polymerization of an aromatic vinyl moiety, and (ii) a polymer block derived from polymerization of at least one monomer having conjugated double bonds, wherein the polymer backbone double bonds are at least partially epoxidized, as essential moieties of the chemical structure. The block copolymer preferably is free of pendent epoxy groups.

In the epoxy-modified aromatic vinyl-conjugated diene block copolymer, the aromatic vinyl polymer block can be derived from polymerization of compounds such as, for example, styrene, alpha-methylstyrene, vinyl toluene, p-tert-butylstyrene, divinylbenzene, p-methylstyrene, 4-n-propylstyrene, 2,4-dimethylstyrene, 3,5-diethylstyrene, 1,1-diphenyl-styrene, 2,4,6-trimethyl styrene, 4-cyclohexylstyrene, 3-methyl-5-n-hexyl styrene, and the like.

Although one or more of aromatic vinyl compounds may be used, styrene is frequently and preferably used.

In the epoxy modified aromatic vinyl-conjugated diene block copolymer, the double bonds in the backbone can be derived from polymerization of compounds having conjugated double bonds such as butadiene, isoprene, 1,3-pentadiene, and the like.

Although one or more compounds having a conjugated double bond may be used, butadiene, isoprene, piperylene and mixtures thereof are frequently and preferably used.

The block copolymer in the present invention essentially includes a polymer block A derived from one or more aromatic vinyl compounds and a polymer block B derived from one or more compounds having a conjugated double bond. The epoxidized aromatic vinyl-conjugated diene block copolymer can be represented by general configurations, for example, $(A-B)_xA$, $(B-A)_x$ and $(A-B)_4Si$, and the like, wherein A and B are as defined above and x is the number of A-B groups in the polymer. The $(A-B)_xA$ type copolymer is generally employed.

The copolymerization weight ratio of the aromatic vinyl compound with respect to the compound having a conjugated double bond is generally 5/95 to 70/30, preferably 10/90 to 60/40.

Unsaturated bonds remaining in the block copolymer may be partially or fully hydrogenated. Alternatively, partial hydrogenation can precede epoxidation.

Preferred epoxidized copolymers include epoxidized non-hydrogenated styrene-butadiene block copolymer (e.g., Epofriend™ A1020, A1010, and A1005, Daicel Chemical Industries LTD, Osaka, Japan). It is anticipated that epoxidized hydrogenated styrene-butadiene block copolymer will be useful in the present invention because of enhanced oxidative stability.

Another preferred epoxidized styrene-diene copolymer that can be used in the covercoat of the invention includes epoxidized styrene-isoprene block copolymers.

Epoxy resins that can be blended and subsequently reacted with the epoxy-modified aromatic vinyl-conjugated diene block copolymer include up to about five (5) weight percent, preferably up to about three (3) weight percent, of an aliphatic or aromatic epoxy resin based on the total weight of the epoxy-bearing materials.

Epoxy resins useful in the covercoat resin compositions of the invention preferably comprise compounds which contain one or more 1,2-, 1,3- and 1,4-cyclic ethers, which also may be known as 1,2-, 1,3- and 1,4-epoxides. The 1,2-cyclic ethers are preferred. Such compounds can be saturated or unsaturated aliphatic, alicyclic, aromatic or heterocyclic, or can comprise combinations thereof. Compounds that contain more than one epoxy group (i.e., polyepoxides) are preferred.

Aromatic polyepoxides (i.e., compounds containing at least one aromatic ring structure, e.g., a benzene ring, and more than one epoxy group) that can be used in the present invention include the polyglycidyl ethers of polyhydric phenols, such as Bisphenol A-type resins and their derivatives, epoxy cresol-novolac resins, Bisphenol-F resins and their derivatives, and epoxy phenol-novolac resins; and glycidyl esters of aromatic carboxylic acids, e.g., phthalic acid diglycidyl ester, isophthalic acid diglycidyl ester, and the like, including mixtures thereof. Preferred aromatic polyepoxides are the polyglycidyl ethers of polyhydric phenols, such as the EPON® series of diglycidyl ethers of Bisphenol-A, including EPON®828, and EPON® 1001F, available commercially from Shell Chemicals, Inc., Houston, Tex. Also preferred are aromatic polyepoxides having lower levels of hydrolyzable chloride, such as EPON® 828 LS, EPON® 1462 (Shell Chemicals, Inc.) and DER™ 332 (Dow Chemical Co., Midland, Mich.).

Aliphatic cyclic polyepoxides may also be used, as cited in U.S. Pat. 6,294,270, incorporated herein by reference.

Catalysts useful in the present invention are photocatalysts, and optionally thermal catalysts or thermal curing agents may be incorporated.

Known photocatalysts include two general types: onium salts and cationic organometallic salts, which are both useful in the invention.

Onium salt photocatalysts for cationic polymerizations of the invention include sulfonium and iodonium complex salts, preferably triarylsulfonium and diaryliodonium salts, wherein "aryl" means an unsubstituted or substituted aromatic moiety.

Triarylsulfonium salts with cations of triphenylsulfonium, diphenyl[p-(phenylthio)phenyl]sulfonium, bis[4-(diphenylsulfonio)phenyl]sulfide, and their mixtures are preferred sulfonium salts. Useful sulfonium salts are described more fully in U.S. Pat. Nos. 4,250,053; 4,256,828; and 5,554,664, all of which are incorporated herein by reference.

Diaryliodonium salts with cations of diphenyliodonium, bis(4-dodecylphenyl)iodonium, 4-(2-hydroxytetradecoxy)phenyl phenyl iodonium, and tolylcumyliodonium, and their mixtures are preferred iodonium salts. Useful aromatic iodonium complex salts are described more fully in U.S. Pat. No. 6,294,270. Iodonium complex salts which can be used are also disclosed therein.

Aromatic sulfonium complex salts useful in the invention are photosensitive only in the ultraviolet region of the spectrum. However, they can be sensitized to the near ultraviolet and the visible range of the spectrum by a select group of sensitizers such as described in U.S. Pat. Nos. 4,256,828 and 4,250,053.

Preferred photocatalysts are the triarylsulfonium and diaryliodonium complex salts; most preferred are the triarylsulfonium complex salts.

Certain thermally-activated catalysts and curing agents for epoxy can be useful in the present invention. These thermally-activated catalysts and curing agents should be chosen such that they do not initiate or enter into crosslinking reactions prior to the photoimaging and developing steps. The material initially cured in the photoimaging step and any subsequent heating or baking steps prior to developing can be further cured after developing by heating to a temperature that is higher than previously experienced and activates the thermal catalysts or curing agents.

Optionally, resin compositions of the present invention may comprise a tackifier. Any suitable tackifier may be employed in the present invention. The tackifier can be present as 0.1–150 parts by weight of tackifier per 100 parts of the resin composition. Useful tackifiers can include rosin esters, aliphatic and aromatic hydrocarbon resins and mixtures thereof, and terpene resins.

In addition, the resin composition may also comprise a polyol. The polyol is preferably reactive with epoxy groups under curing conditions. The polyol can be useful as a chain extender in epoxy resin formulations. The polyol may be included in a weight ratio, relative to the epoxy resin, of between 0.1/99.9 to 40/60. These polyols may be based on ethylene oxide, propylene oxide, butene oxide, cyclohexane based diols and the like, or mixtures thereof.

Other polyols suitable for use in the production of epoxy resins useful in the invention include the hydroxyalkyl ethers obtained by the addition of optionally substituted alkylene oxides, such as ethylene oxide, propylene oxide, butylene oxide and styrene oxide, onto the above-mentioned polyols.

Optional components of the present invention are stabilizers that inhibit or retard heat degradation, oxidation, skin formation and color formation. Stabilizers are typically added to formulations of the invention in order to protect the polymers against heat degradation and oxidation during preparation, use and high temperature storage of the compositions. Additional stabilizers known in the art may also be incorporated into the composition to protect against, for example, oxygen, ozone, and ultraviolet radiation. However, these additional stabilizers should be compatible with the primary stabilizers noted above.

In addition, the resin composition may comprise from 0 up to 99 parts by weight of an aromatic vinyl-conjugated diene block copolymer per 100 parts by weight of epoxy-modified aromatic vinyl-conjugated diene block copolymer. Styrene-butadiene and styrene-isoprene block copolymers, wherein the diene block may be hydrogenated, are preferred members of this group.

Various adjuvants can also be added to the compositions of the invention to alter the physical characteristics of the final material. Useful adjuvants include thixotropic agents such as fumed silica; pigments to enhance color tones such as ferric oxide, carbon black and titanium dioxide; fillers such as mica, silica, acicular wollastonite, calcium carbonate, magnesium sulfate and calcium sulfate; electrically and/or thermally conductive fillers, including metal particles, graphite, and metal-coated microspheres; chopped fibers and whiskers, including glass and carbon; clays such as bentonite; glass beads and bubbles; reinforcing materials such as unidirectional woven and nonwoven webs of organic and inorganic fibers such as polyester, polyimide, glass fibers, polyamides such as poly(p-phenylene terephthalamide), carbon fibers, and ceramic fibers. Varying amounts up to about of adjuvant are permissible, so long as they do not negatively affect the photoimageability or other critical properties.

The protective covercoat of the invention may be formed by solvent coating or by extrusion, preferably onto a liner. Such liner may have a surface treatment or coating to encourage the release of materials coated thereon, so long as said treatment or coating does not interfere with the properties of the photoimageable covercoat. Solvent coating is done by conventional solvent casting methods followed by drying to remove the solvent.

The protective covercoat of the invention may be applied to the desired substrate by means of conventional lamination techniques, and may be done in a normal environment, or under vacuum conditions, as desired for the application. The process for heat-lamination of the dry film photoimageable material is extendable so that one or both sides of the flexible circuitry can be covered with the material, either simultaneously or sequentially. Photoimaging of both sides then provides a pattern of dielectric coverage which may be useful for protection or for retaining flatness of the electronic device.

The handling characteristics of the dry film version of the photoimageable epoxidized styrene-butadiene-styrene (eSBS) makes it especially attractive for defining a pattern of dielectric on apertures of an electronic circuit device as disclosed in U.S. Pat. No. 6,294,270, incorporated herein by reference. Single or double-sided application of the dry film product covers apertures in the circuit device. Ultraviolet (UV) radiation exposure through a mask then allows definition of retained dielectric material after processing in specified portions of the aperture. Such usage may be beneficial in protecting circuit traces which extend into these apertures. This coverage is also possible when coating the material directly onto the circuit device from a solvent.

Figure 2:
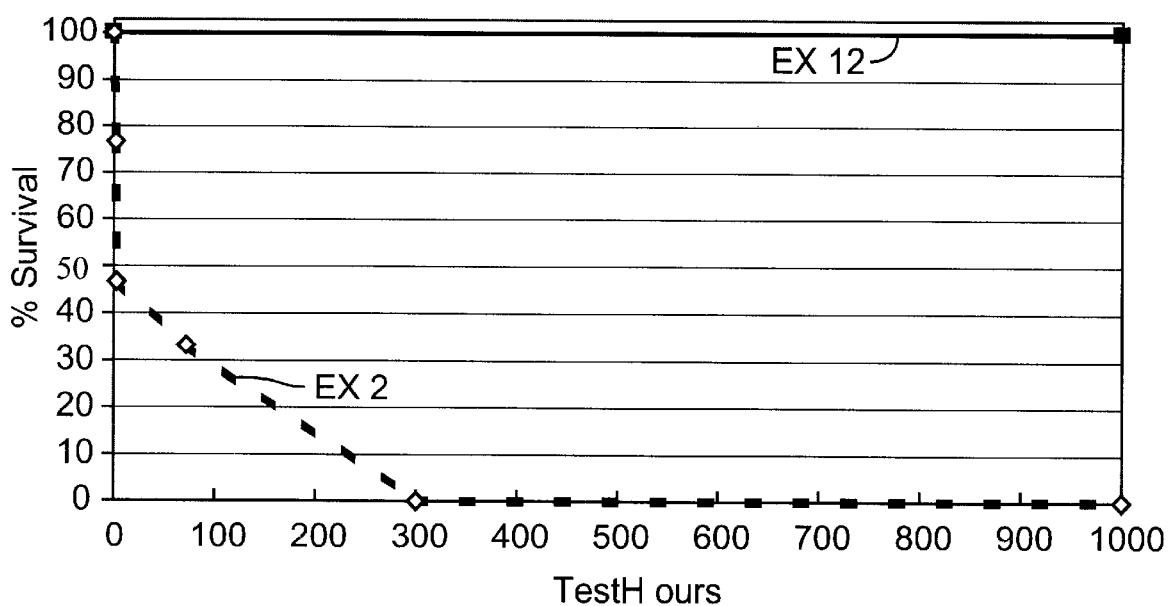
FIG. 2 is a graph showing the performance of photoimageable eSBS material and a commercial liquid screenable epoxy urethane acrylate at 10–15 volts bias in an ink environment.

FIGS. 1 and 2 show the superiority of the photoimageable eSBS-based material system to the photoimageable dielectric materials described in Comparative Example 1 and Comparative Example 2. FIG. 1 shows performance of the eSBS based material (Example 12) versus the dry film photoimageable epoxy material (Comparative Example 1) using a group of inks with testing performed for 1000 hours at a bias of 20–30 volts. Twenty-two circuit specimens were used for the subject eSBS material and 10 specimens used for the photoimageable epoxy. FIG. 2 shows the performance of the subject eSBS-based material (Example 12) versus the liquid screenable photoimageable epoxy urethane acrylate (Comparative Example 2) using another group of inks with testing performed for 1000 hours at 10–15 volts bias. Thirty specimens were used for each material system.

The following examples are for illustrative purposes, and should not be interpreted as limiting the scope of the invention, which is that of the claims.

EXAMPLES

Example 1

This formulation included:

Epofriend® A1020 eSBS Copolymer (97.5%) epoxy modified aromatic vinyl-conjugated diene block copolymer Epon® 828 epoxy (2.5%): epoxy resin Solid Triarylsulfonium hexafluoroantimonate salt mixture (0.042%):

Photoinitiator (PI)

In the following discussion, this will be referenced as the "base formulation". This material was melt compound extruded onto a silicone-treated release liner at a thickness of approximately 70 $\mu$m (2.75 mils). The resulting film material was hot roll laminated 82° C. onto a strip of flex circuitry at a line speed of 0.2–0.3 m/min.

A patterned photomask was positioned adjacent to the circuit/film laminate, which was then exposed to a UV light source. The medium pressure mercury UV light source was set to provide an exposure dosage of 1000 mJ/cm$^2$ to produce the desired pattern. The laminate was subsequently baked for 15 minutes at 125° C. in air. The unexposed material was developed away in a solvent bath. Useful solvents for this bath include ethyl hexyl acetate (EHA), n-methyl pyrrolidinone (NMP) or a 50/50 mixture of EHA and gamma-butyrolactone (GBL). After developing, the exposed regions showed limited resistance to the developer solvent while the unexposed material in the unexposed regions was removed. The limited resistance of the exposed regions was exhibited by excessive swelling of the material, which led to its lifting and detachment from gold-plated copper features on the circuit as well as the polyimide film support layer. While this example showed promising results it showed that formulation refinements were needed to minimize the swelling of the dielectric material which in turn would improve the quality of the photoimaged pattern after developing. The final curing of the material involved a second UV exposure with an exposure dosage of 1000 mJ/cm$^2$ followed by a 30 minute final bake in a 175° C. oven with circulating air.

Solvent Coating

A second method for creating a laminating film useful for this invention is to solvent cast the film onto a release liner and evaporate off the solvent. This material was subsequently hot roll laminated to a strip of flex circuit material.

The triarylsulfonium hexafluoroantimonate photoinitiator catalyst solution, UVI-6974, Dow Chemical Company, Midland, Mich., was used rather than the solid material used in the extruded formulation (Example 1). To prepare the solvent mixture for coating, an "Epofriend® Solution" consisting of 25% Epofriend® A1020 by weight in ethyl acetate was prepared by mixing until the Epofriend® was completely dissolved in the ethyl acetate. Other useful solvents for this process may include NMP, toluene, EHA, or higher molecular weight acetates. To this solution, a desired amount of EPON® 828 was added. Finally, the catalyst solution was added. The solution may be filtered if necessary prior to coating.

These solutions were coated onto a silicone-coated polyester release film so that films approximately 76 $\mu$m (3 mils) thick were obtained after evaporating the ethyl acetate solvent at 50–60° C. The dried films were hot roll laminated at 82° C. onto the flex circuitry at a speed of 0.2–0.3 m/min.

Examples 2–6

Examples 2 through 6 in Table 1 show formulations which contain constant amounts of the Epofriend® material and the Epon® 828 epoxy with different photoinitiator levels. The coating solutions were prepared using the aforementioned solvent process using ethyl acetate as a solvent to facilitate the mixing. A shorthand notation was used to reflect the amount of photoinitiator salt relative to the base formulation. A "1×" designation represented the 0.042% photoinitiator salt concentration relative to the total amount of dissolved solids.

TABLE 1

Solvent Coated Epoxy & Cyracure-Modified Formulas

| | Example | | | | |
|---|---|---|---|---|---|
| | 2 | 3 | 4 | 5 | 6 |
| Epofriend Solution (g) | 75.0 | 75.0 | 75.0 | 75.0 | 75.0 |
| Epon 828 (g) | 0.481 | 0.481 | 0.481 | 0.481 | 0.481 |
| Catalyst Solution (g) | 0.016 | 0.081 | 0.161 | 0.808 | 1.615 |
| Catalyst content compared to Example 1 | 1X | 5X | 10X | 50X | 100X |

Examples 7–11

Examples 7–11 in Table 2 show formulations that contain solely the Epofriend® material and different photoinitiator levels. The coating solutions were prepared using the aforementioned solvent process using ethyl acetate as a solvent to facilitate the mixing.

TABLE 2

Solvent coated Cryacure-Only Modified Formulas

| | Example | | | | |
|---|---|---|---|---|---|
| | 7 | 8 | 9 | 10 | 11 |
| Epofriend Solution (g) | 75.0 | 75.0 | 75.0 | 75.0 | 75.0 |
| Catalyst Solution | 0.016 | 0.079 | 0.158 | 0.787 | 1.575 |
| Catalyst content compared to Example 1 | 1X | 5X | 10X | 50X | 100X |

These solutions were coated onto a silicone-coated polyester film so that films approximately 76 μm (3 mils) thick were obtained after evaporating the ethyl acetate solvent at 50–60° C. The dried films were hot roll laminated onto circuitry and exposed to 1000 mJ/cm² UV radiation as before. The laminate was subsequently baked for 15–30 minutes at 125° C. in air. Developing was conducted in a Schmiedeskamp Probimer® 450M developer at a speed of 1 m/min. Sumps 1 and 2 were filled with a 50% EHA/50% GBL, Sump 3 with 75% EHA/25% GBL, and Sump 4 with 100% EHA. Spray pressure was three bar. Total residence time in the solvent chambers was 2–2.5 minutes. Solvent temperature was 27–28° C. The sample was then dried for 10 minutes at a temperature 40–60° C. The final curing of the material involved a second UV exposure with an exposure dosage of 1000 mJ/cm² followed by a 30 minute final bake in a 175° C. convection oven.

Examination of the developed parts showed that, for the same photoinitiator concentrations, swelling (as described in Example 1) was more pronounced on the formulations containing the Epon® 828 (examples 2–6) than in the samples that did not contain the EPON 828 (examples 7–11).

In addition, good contrast was noted with photoinitiator concentrations as low as 10x for both Example 4, containing Epon® 828 and formulation Example 9, which contains no Epon® 828. 5xphotoinitiator concentrations, Examples 3 and 8, offered a contrast benefit over the 1xphotoinitiator formulations (Examples 2 and 7). The 50×and 100× photoinitiator levels led to the formation of materials which were overly active when exposed. The material systems cured well beyond the regions exposed to ultraviolet light. For example, a 10xphotoinitiator level at 1000 μm/cm² exposure would be characterized by cure of material 150–250 micrometers beyond the expose mask window. At the 50×and 100×photoinitiator level, the cured region would extend 250–500 micrometers beyond the expose mask window. Additionally, the 50×and 100×photoinitiator level materials exhibited no improvement in resistance to swelling.

The exposure energy was optimized using a formulation analogous to Example 9. It was demonstrated that UV exposure energies of 100 mJ/cm² were adequate to provide good edge definition. Higher UV exposure energies (200 to 1000 mJ/cm²) showed an increase tendency towards "blooming". This was exhibited as failure to resolve small, unexposed features and in the formation of a "foot" or poorly defined edge of exposed regions. For example, using the 10xphotoinitiator material system with a 100 mJ/cm² exposure provided cure 75–100 micrometers outside the expose mask window. An exposure level of 1000 mJ/cm² leads to cure 150–250 micrometers beyond the exposed mask window. In addition, exposure levels about 100 mJ/cm² yielded no improvement in resistance to swelling.

Example 12

This Example included the following:
- 99.2% Epofriend® A1020
- 0.84% Cyracure® UVI-6974 (Contributing 0.42% triarylsulfonium hexafluoroantimonate salt mixture and 0.42% propylene carbonate).

These components, dissolved in ethyl acetate at a 33% solids level, were coated onto a silicone-coated polyester film so that films approximately 76 μm thick were obtained after evaporating the ethyl acetate solvent at 50–60° C. The dried films were hot roll laminated onto circuitry and exposed to 100 mJ/cm² UV radiation as before. The laminate was subsequently baked for 30 minutes at 125° C. in air. Developing was conducted in a Schmiedeskamp Probimer® 450M developer at a speed of 1 m/min. Sumps 1 and 2 were filled with a 50% EHA/50% GBL, Sump 3 with 75% EHA/25% GBL, and Sump 4 with 100% EHA. Spray pressure was 3 bar. Total residence time in the solvent chambers was 2–2.5 minutes. Solvent temperature was 27–28° C. The sample was then dried for 10 minutes at a temperature 40–60° C. The final curing of the material involved a second UV exposure with an exposure dosage of 1000 mJ/cm² followed by a 30 minute final bake in a 175° C. convection oven.

Comparative Example 1

The first, a commercial dry film photoimageable epoxy material, was processed on polyimide-based flex circuitry. This film was vacuum laminated to flex circuitry using a Dynachem 724 vacuum laminator for 1.5 minutes at a temperature of 72° C. The laminated structure was baked for 30 minutes at 90° C. in a convection oven. The photoimageable epoxy material was then exposed at 1600 mJ/cm² and developed at 1 m/min in a Schmiedeskamp Probimer® 450M developer using only gammabutyrolactone as a developer solvent. The resultant developed film was then UV exposed at a dosage of 2000 mJ/cm² and then backed in a 180° C. circulating air oven for one hour. The processed thickness of the photoimageable epoxy material was about 64 μm.

Comparative Example 2

The second material was a commercially available liquid screenable epoxy urethane acrylate. It was screen printed onto the flexible polyimide circuitry to achieve a final processed thickness of 64–76 µm. It was then exposed at 500 mJ/cm² and developed in a 1% sodium carbonate (in water) solution at a speed of 1.3 m/min. Final cure was at 150° C. for 30 minutes in a circulating air oven.

Coating Integrity Test

One method of testing the covercoat integrity and environmental resistance on a flexible circuit is to place voltage bias on a circuit while subjecting the part to different harsh environmental conditions including high temperature/high humidity conditions, cycling between temperature extremes, submersion in a corrosive fluid, and the like. One such corrosive fluid category is ink, encountered in certain printing environments where polyimide-based flexible circuitry is used. Typical ink compositions include solvents, pigments, electrolytes, and water. To determine the adequacy of the disclosed material to withstand an ink environment, candidate photoimageable materials were applied to flexible polyimide circuits that contained a pattern of parallel of circuit lines. In this design, neighboring parallel lines are under an imposed electrical bias, described in volts. These gold-plated copper lines or "traces" were spaced approximately 50–75 µm apart and covered with one of several protective coatings before immersing in ink. The thickness of the metal features was 18–35 µm. When placed in an ink environment, particularly at extra-ambient temperatures, the electrical bias accelerates the failure of materials covering the circuit lines. Performance is quantified by depicting the survival rate of a group of circuits over time. For the purpose of evaluating these protective materials, failure was defined as the time when current leakage between adjacent traces exceeded 10 microAmps (µA).

What is claimed is:

1. An electronic circuit device comprising at least one substrate having a photoimageable covercoat coated on at least a portion of said substrate, said covercoat comprising at least about 95% of at least one epoxy-modified aromatic vinyl-conjugated diene block copolymer and a catalyst comprising an onium salt selected from a triarylsulfonium salt and a diaryliodonium salt, wherein said covercoat is formed by a process selected from the group consisting of solvent coating and extrusion, said covercoat subsequently being laminated to least a portion of said substrate.

2. An electronic circuit device according to claim 1 wherein said covercoat is solvent coated onto a liner.

3. An electronic circuit device according to claim 1 wherein said covercoat is extruded onto a liner to form a dry film.

4. An electronic circuit device according to claim 1 wherein said catalyst is present in a catalyst solution.

5. An electronic circuit according to claim 1 wherein said catalyst is present in solid form.

6. An electronic circuit device according to claim 1 wherein said epoxy-modified vinyl-conjugated diene block copolymer has an aromatic vinyl polymer block derived from styrene.

7. An electronic circuit device according to claim 6 comprising an epoxidized nonhydrogenated styrene-butadiene block copolymer.

8. An electronic circuit device according to claim 6 wherein said block copolymer comprises at least about 95 weight percent of said covercoat, exclusive of catalyst.

9. An electronic circuit device according to claim 4 wherein said catalyst solution comprises about 50% solids, and the catalyst solution is present in an amount of from about 0.5% to about 3% by weight.

10. An electronic circuit device according to claim 9 wherein said catalyst solution comprises a triarylsulfonium hexafluoroantimonate in propylene carbonate.

11. An electronic circuit device according to claim 1 further comprising at least one additional epoxy bearing material in an amount of less than about 10 weight percent, exclusive of said catalyst.

12. An electronic circuit device comprising at least one substrate having a photoimageable covercoat coated on at least a portion thereof, said covercoat comprising at least about 90% of at least one epoxy-modified aromatic vinyl-conjugated diene block copolymer and a solid catalyst comprising an onium salt selected from a triarylsulfonium salt and a diaryliodonium salt, wherein said covercoat is formed by melt extrusion onto a liner to form a dry film, said film subsequently being heat laminated onto said substrate to form said device.

13. An electronic circuit device according to claim 12 wherein said catalyst is present in solid form.

14. An electronic circuit device according to claim 13 wherein said catalyst is a solid triarylsulfonium hexafluoroantimonate salt mixture.

15. A method of using a covercoat in an article comprising the steps of:

forming a curable resin composition on a liner by a means selected from the group consisting of extrusion and solvent coating, said resin composition including in the range of 95 to 100 weight percent of an epoxy-modified aromatic vinyl-conjugated diene block copolymer, optionally up to 5 weight percent of an epoxy resin, the weight of both components based on the weight of epoxy-bearing materials, and from about 0.25 to about 1.5 weight percent of an epoxy catalyst, and laminating said covercoat onto at least a portion into an electronic circuit device.

16. A method according to claim 15 wherein said covercoat is formed on said liner by means of melt extrusion.

17. A method according to claim 15 wherein said covercoat is formed on said liner by means of solvent casting, followed by drying to remove excess solvent.

18. A method according to claim 15 wherein said epoxy-modified vinyl-conjugated diene block copolymer has an aromatic vinyl polymer block derived from styrene.

19. A method according to claim 15 comprising an epoxidized nonhydrogenated styrene-butadiene block copolymer.

20. An electronic circuit device according to claim 15 wherein said block copolymer comprises at least about 95 weight percent of said covercoat, exclusive of catalyst.

21. An electronic circuit device according to claim 1 further including at least one aperture in said substrate, wherein said covercoat at least partially encapsulates said aperture.

* * * * *

UNITED STATES PATENT AND TRADEMARK OFFICE
CERTIFICATE OF CORRECTION

PATENT NO.     : 6,489,042 B2
DATED          : December 3, 2002
INVENTOR(S)    : Imken, Ronald L.

It is certified that error appears in the above-identified patent and that said Letters Patent is hereby corrected as shown below:

<u>Column 8,</u>
Line 65, "A "1x" designation" should read -- A "1X" designation --.

<u>Column 9,</u>
Line 58, "as low as 10xfor both" should read -- as low as 10X for both --.
Line 60, "5xphotoinitiator concentrations" should read -- 5X photoinitiator concentrations --.
Line 61, "over the 1xphotoinitiator" should read -- over the 1X photoinitiator --.
Line 62, "The 50xand 100x" should read -- The 50X and 100X --.
Line 66, "10x photoinitiator" should read -- 10X photoinitiator --.

<u>Column 10,</u>
Line 2, "the 50xand 100xphotoinitiator" should read -- the 50X and 100X photoinitiator --.
Line 4, "the 50xand 100x photoinitiator" should read -- the 50X and 100X photoinitiator --.
Line 15, "the 10xphotoinitiator" should read -- the 10X photoinitiator --.

Signed and Sealed this

Eighth Day of April, 2003

JAMES E. ROGAN
*Director of the United States Patent and Trademark Office*